US006819400B2

(12) United States Patent
Ravensbergen

(10) Patent No.: US 6,819,400 B2
(45) Date of Patent: Nov. 16, 2004

(54) LITHOGRAPHIC APPARATUS AND DEVICE MANUFACTURING METHOD

(75) Inventor: Marius Ravensbergen, Bergeijk (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/386,932

(22) Filed: Mar. 13, 2003

(65) Prior Publication Data

US 2003/0179357 A1 Sep. 25, 2003

(30) Foreign Application Priority Data

Mar. 15, 2002 (EP) .............................................. 02251855

(51) Int. Cl.[7] .......................... G03B 27/52; G03B 27/54
(52) U.S. Cl. .......................................... 355/55; 355/67
(58) Field of Search ...................................... 355/55, 67

(56) References Cited

U.S. PATENT DOCUMENTS

| 5,283,434 A | * | 2/1994 | Ishizuka et al. | ........ 250/237 G |
| 5,534,693 A | * | 7/1996 | Kondo et al. | ........... 250/237 G |
| 5,569,913 A | * | 10/1996 | Ishizuka et al. | ........ 250/237 G |
| 5,574,558 A | * | 11/1996 | Kudo et al. | ................. 356/499 |
| 5,621,527 A | * | 4/1997 | Kaneda et al. | .............. 356/499 |
| 5,657,125 A | * | 8/1997 | Kato et al. | ................... 356/499 |
| 5,666,196 A | * | 9/1997 | Ishii et al. | .................... 356/499 |
| 5,953,106 A | * | 9/1999 | Unno et al. | .................... 355/55 |
| 5,991,004 A | | 11/1999 | Wallace et al. | |

FOREIGN PATENT DOCUMENTS

| EP | 1 107 068 A2 | 6/2001 |
| JP | 55-33679 | 3/1980 |
| JP | 10-2761 | 1/1998 |

OTHER PUBLICATIONS

Spaner, et al., "Interferntial Linear Encoder with 270mm Measuring Length for Nanometrology," Heidenhain technical article, Apr. 11, 2000.*

Spies, "Linear and Angular Encoders for the High–Resolution Range," Nano and Micro Metrology—Sensors and Instruments, pp. 54–57.

* cited by examiner

Primary Examiner—Rodney Fuller
(74) Attorney, Agent, or Firm—Pillsbury Winthrop LLP

(57) ABSTRACT

A displacement measurement system constructed and arranged to measure the position of optical elements in a projection system of a lithographic projection apparatus makes use of the interferential measurement principle which involves use of a first diffraction grating mounted on the optical element and a second diffraction grating mounted on a reference frame.

20 Claims, 2 Drawing Sheets

LITHOGRAPHIC APPARATUS AND DEVICE MANUFACTURING METHOD

RELATED APPLICATION

This application claims the benefit of priority to European Patent Application No. 02251855.9, filed Mar. 15, 2002, the contents of which are herein incorporated by reference.

BACKGROUND OF THE INVENTION

1. Field of the Invention

The present invention relates to a lithographic apparatus and a device manufacturing method.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support structure may be embodied as a frame or table, for example, which may be fixed or movable as required.

Another example of a patterning device is a programmable LCD array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (IC's). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried our on one or more tables while one or more other tables are being used for exposures. Dual stage lithographic apparatus are described, for example, in U.S. Pat. Nos. 5,969,441 and 6,262,796.

One of the most challenging requirements for microlithography for the production of integrated circuits, as well as liquid crystal display panels and other types of devices, is the positioning of the optical elements in the project system PL. For example, lenses used in conventional lithographic projection apparatus need to be positioned to an accuracy of less than 10 nm in six degrees of freedom (DOF). An EUV lithography apparatus must use mirrors in the projection system because no material suitable for forming a refractive optical element for EUV is known and must be kept in vacuum to avoid contamination and attenuation of the beam. At the wavelength used in an EUV system, positioning accuracy below 0.1 nm is required.

Presently, lenses and mirrors are positioned using a coarse positioning actuator with micrometer accuracies but travelling over the entire working range, onto which is cascaded a fine positioning actuator. The later is responsible for correcting for the residual error of the coarse positioning module to the last few nanometers, or fractions thereof as the case may be, but only needs to accommodate a very limited range of travel. Commonly used actuators for such nano-positioning include piezoelectric actuators or voice-coil type electro magnetic actuators. While positioning in the fine module is usually effected in all six degrees of freedom, large-range motions are rarely required for more than two degrees of freedom, thus simplifying the design of the coarse module considerably.

The micrometer accuracy required for the coarse positioning can readily be achieved using well known position sensors, such as interferometers. These can be single-axis devices each measuring in one degree of freedom. However, these devices are expensive, bulky, are not capable of repeatable measurements, and only capable of measuring changes in displacement rather than absolute position.

Position measurement of the optical element at the fine positioning actuator, on the other hand, has to be performed in all six degrees of freedom to 10 nm. With present requirements capacitive sensors are used.

As ever finer resolution is required, the wavelength of the radiation of the lithographic projection has been reduced (from 157 nm) to the EUV range with a wavelength of about 5 to 20 nm. Thus, the required positional accuracy has become yet more refined. It has been found that the necessary accuracy of position measurement is not achievable using capacitive sensors because it is not possible to discriminate between rotation and displacement of capacitive sensors. Furthermore, capacitive sensors are not temperature stable over the entire working range.

Thus, in an EUV lithographic projection apparatus there is a requirement for a displacement measuring system with a higher resolution than the previously used capacitive sensors, which is both compact and can be used to measure the position of the optical elements in all six degrees of freedom. The sensors will also need to be insensitive to temperature fluctuations.

SUMMARY OF THE INVENTION

It is an aspect of the present invention to provide an improved displacement measuring system for use in a lithographic projection apparatus in which the problems described above are solved or ameliorated.

This and other aspects are achieved according to the present invention in a lithographic apparatus including a radiation system constructed and arranged to supply a beam of radiation; a support structure constructed and arranged to support a patterning device, the patterning device constructed and arranged to pattern the beam according to a desired pattern; a substrate table constructed and arranged to hold a substrate; a projection system, comprising at least one optical element, constructed and arranged to project the patterned beam onto a target portion of the substrate; and a displacement measuring system constructed and arranged to measure the position of the at least one optical element, wherein the displacement measurement system comprises a first diffraction grating mounted on the at least one optical element and an associated second diffraction grating mounted on a reference frame, and one of the first and second diffraction gratings is arranged to receive diffracted light from the other diffraction grating.

In this way the position of the optical element to which the first diffraction grating is mounted may be reliably measured in one degree of freedom using the interferential measurement principle which can yield an accuracy of up to 0.1 nm. When the first diffraction grating moves relative to the second diffraction grating, phase differences in the light waves are generated by the diffraction grating arranged to receive diffracted light from the other diffraction grating. These generated phase differences are proportional to the displacement of one diffraction grating relative to the other and their measurement can thereby be used to accurately measure the position of the optical element with the interferential measurement principle using single field scanning.

The displacement measuring system of the present invention works on the principles described by SPIES, A. in "Linear and Angular Encoders for the High-Resolution Range", Progress in Precision Engineering and Nanotechnology, Braunschweig, 1997, incorporated herein by reference. Similar encoders are also available commercially, e.g. interferential linear encoder LIP 382 from Dr Johannes Heidenhain GmbH, Traunreut, Germany.

Apart from the good accuracy of the displacement measuring system of the present invention, the system can be made compact and easily made vacuum compliant and temperature stable by careful choice of materials for the various components.

In an embodiment of the present invention, each diffraction grating has an associated grating pattern with reference marks for defining a reference position of the moveable object. In this way, the absolute position of the moveable object can be measured.

The displacement measurement system further comprises a light source constructed and arranged to generate a source of light, the displacement measuring system being arranged such that the source of light is diffracted by one of the first and second diffraction gratings thereby to generate a first diffracted light signal, wherein the first diffracted light signal is diffracted by the other of the first and second diffraction gratings thereby to generate a second diffracted light signal, wherein the second diffracted light signal is diffracted by the one of the first and second diffraction gratings thereby to generate a third diffracted light signal. One of the first and second diffraction gratings is a transparent diffraction grating and the other of the first and second diffraction gratings is a reflective diffraction grating. In this way, the displacement measurement device can be kept small and the light source and any optical sensors can be positioned close to one another adjacent the one of the first and second diffraction gratings.

The displacement measurement system may include at least two first diffraction gratings and at least two second diffraction gratings, respective pairs of first and second diffraction gratings being mounted substantially orthogonally. In this way, the position of the optical element in two degrees of freedom may be measured. It will be apparent that the position of the optical element may be measured in all six degrees of freedom by providing a pair of first and second diffraction gratings for each degree of freedom.

According to a further aspect of the invention there is provided a device manufacturing method including providing a substrate that is at least partially covered by a layer of radiation-sensitive material; projecting a patterned beam of radiation, using at least one optical clement, onto a target portion of the layer of radiation-sensitive material; and measuring the position of the at least one optical element by: providing a first diffraction grating mounted on the at least one optical element and a second diffraction grating mounted on a reference frame; and diffracting light diffracted by one of the first and second diffraction gratings with the other of the first and second diffraction gratings.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. One of ordinary skill in the art will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and extreme ultra-violet (EUV) radiation (e.g. having a wavelength in the range 5–20 nm, especially around 13 nm), as well as particle beams, such as ion beams or electron beams.

BRIEF DESCRIPTION OF THE DRAWINGS

Embodiments of the present invention will now be described, by way of example only, with reference to the accompanying schematic drawings in which.

In the Figures, corresponding reference symbols indicate corresponding parts.

DETAILED DESCRIPTION

Figure 1:
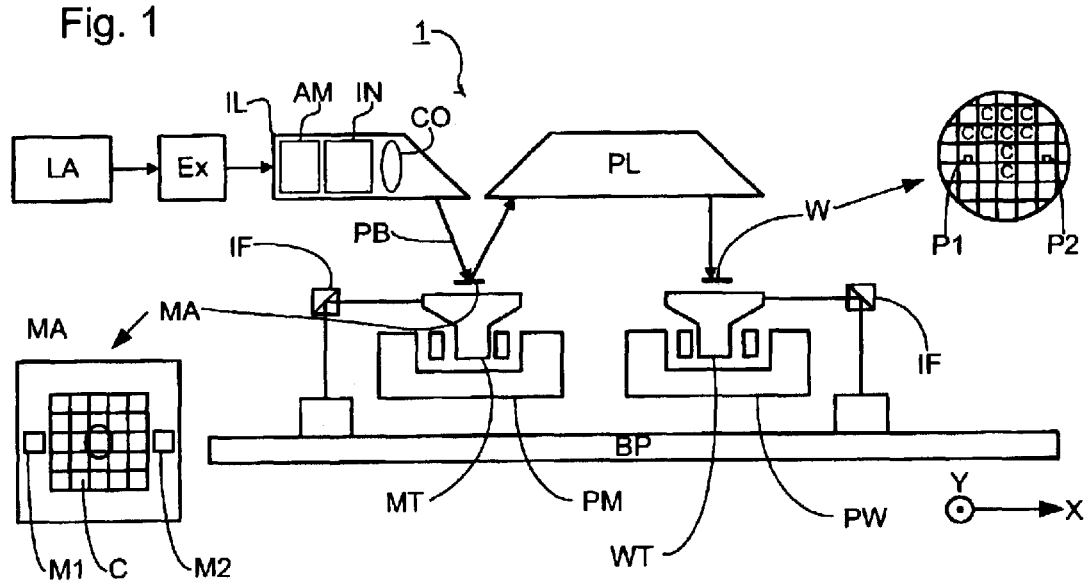
FIG. 1 depicts a lithographic projection apparatus according to an embodiment of the invention.

FIG. 1 schematically depicts a lithographic projection apparatus 1 according to an embodimemt of the invention. The apparatus 1 includes a base plate BP; a radiation system Ex, IL constructed and arranged to supply a beam PB of radiation (e.g. EUV radiation), which in this particular case also comprises a radiation source LA; a first object (mask) table MT provided with a mask bolder constructed and arranged to hold a mask MA (e.g. a reticle), and connected to a first positioning device PM that accurately positions the mask with respect to a projection system or lens PL; a second object (substrate) table WT provided with a substrate holder constructed and arranged to bold a substrate W (e.g. a resist-coated silicon wafer), and connected to a second positioning device PW that accurately positions the substrate with respect to the projection system PL. The projection system or lens PL (e.g. a mirror group) is constructed and arranged to image an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example with a transmissive mask. Alternatively, the apparatus may employ another kind of patterning device, such as a programmable mirror array of a type as referred to above.

The source LA (e.g. a discharge or laser-produced plasma source) produces a beam of radiation. This beam is fed into an illumination system (illuminator) IL, either directly or after having traversed a conditioning device, such as a beam expander Ex, for example. The illuminator IL may comprise an adjusting device AM that sets the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus, as is often the case when the source LA is a mercury lamp, for example, but that it may also be remote from the lithographic projection apparatus, the radiation beam which it produces being led into the apparatus (e.g. with the aid of suitable directing mirrors). This latter scenario is often the case when the source LA is an excimer laser. The present invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW and interferometer IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;
2. In scan mode, essentially the same scenario applies, except that a given target portion C is no: exposed in a single "flash". Instead, the mask table MT is movable in a given direction (the so-called "scan direction", e.g., the Y direction) with a speed v, so that the beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

In a lithography apparatus using 157 nm wavelength radiation, the projection system PL has one or more optical elements (lenses) which need to be accurately positioned relative to a reference frame 30. With the advent of EUV technology, it is necessary to use mirrors exclusively instead of lenses to focus the beam PB in the projection system PL. Thus, EUV optical elements in the projection system PL not only require higher positioning accuracy because of the shorter wavelength of radiation used but also require a higher positioning accuracy, by a factor of two, because they are used in reflective, rather than refractive, mode. Higher accuracy is also needed because of the increasing resolution. Therefore, the present invention is suited for use in an EUV type of lithography apparatus.

Optical elements in the projection system PL often need to be positioned with six degrees of freedom. In the case of optical elements in the projection system PL of an EUV apparatus, the positioning accuracy is of the order of 0.1 nm. A typical EUV apparatus will include six mirrors in the projection system PL, each of which may be positioned with six degrees of freedom relative to the a reference frame 30.

Figure 2:
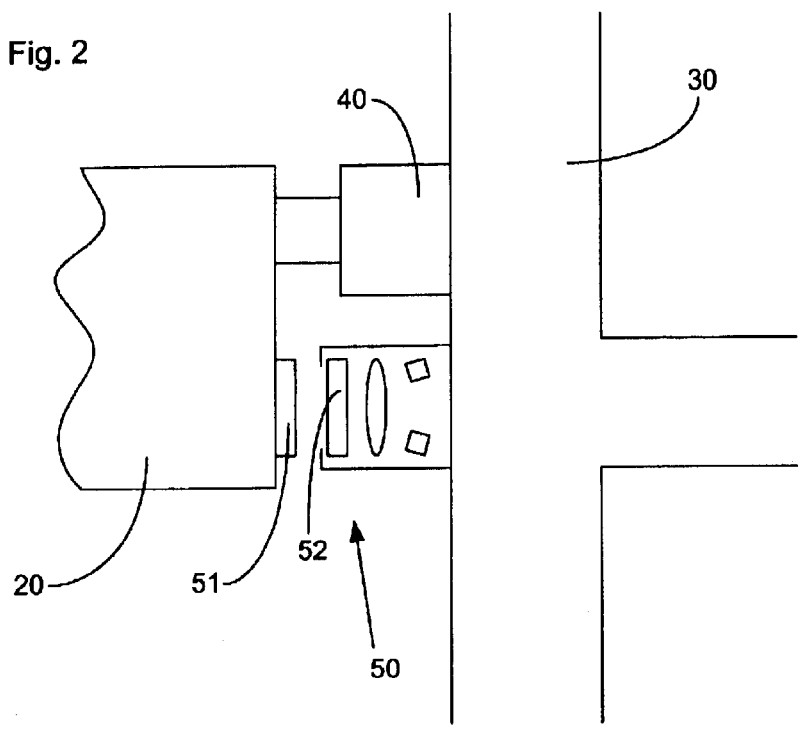
FIG. 2 illustrates the juxtaposition of the optical element, reference frame and displacement measurement system of the present invention.

FIG. 2 illustrates the connection of an optical element 20 relative to the reference frame 30 via an actuator 40. Such an arrangement is disclosed in, for example, U.S. Pat. Application Publication 2003/0197914 A1, incorporated herein by reference. A displacement measuring system 50 is also illustrated schematically. One part of the displacement measuring system 50 is attached to the reference frame 30, in the present embodiment a projection objects box, and another part of the displacement measurement system 50 is attached to the optical member 20. There is no physical contact between the two parts of the displacement measuring system 50.

Figure 3:
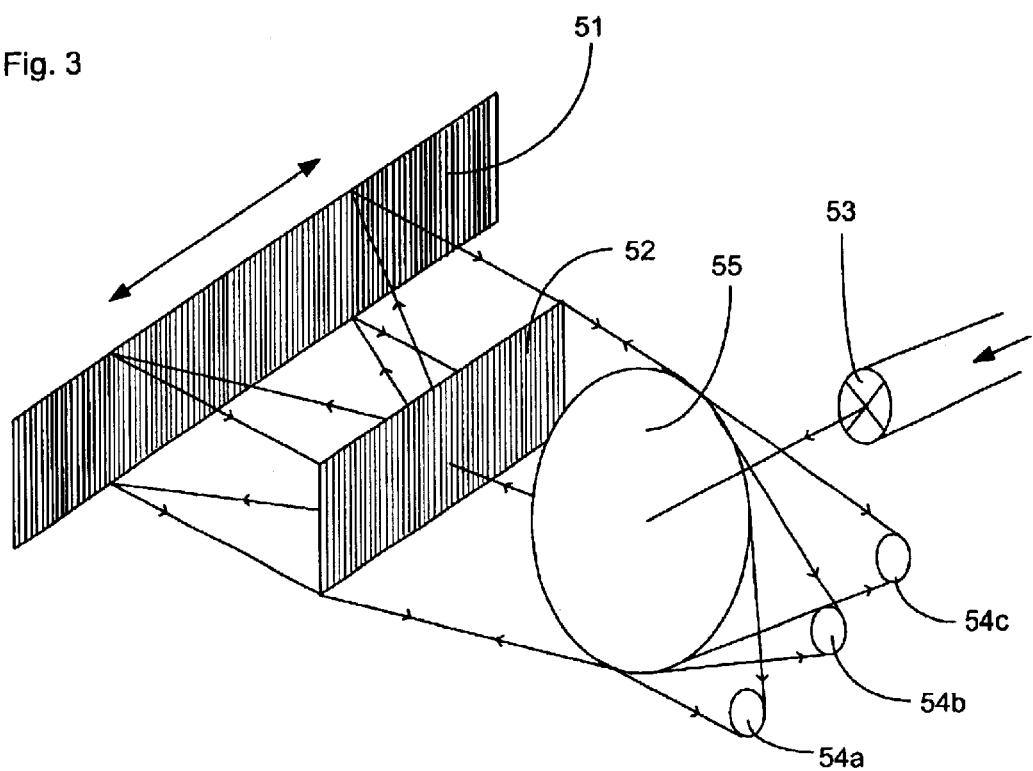
FIG. 3 depicts a displacement measurement system of the present invention.

The displacement measuring system 50 will now be described in more detail with reference to FIGS. 2 and 3. The displacement measurement system comprises a first diffraction grating 51 which is attached to the optical element 20. This may be effected by etching the diffraction pattern on the surface of the optical element 20 or by molecular bonding of the diffraction grating on the mirror surface. In the later case the diffraction grating may be manufactured from a low thermal expansion material such as ZERODUR® or ULE® and the diffraction pattern may be chromium lines. A grating period of 512 nm is suitable and the diffraction grating is a reflective diffraction grating.

The second component of the displacement measurement system 50 is a second diffraction grating 52 which is fixed to the projection objects box 30. In the illustrated embodiment the second diffraction grating is a transmissive diffraction grating with a grating period of 512 nm, i.e. the same as the first diffraction grating, but the period may be larger. The second diffraction grating 52 is also made of a low thermal expansion material such as ZERODUR® or ULE®.

The diffraction gratings 51 and 52 may be manufactured in the same way as a reticle of a lithographic projection apparatus. As the position of the second diffraction grating 52 is fixed relative to the reference frame 30 the length of the second diffraction grating 52 may be shorter than that of the first diffraction grating 51. The first diffraction grating 51 is chosen to suit the desired amount of movement of the optical element 20. In the EUV system this might be about 1 mm.

Although the displacement measurement system 50 is described with the first diffraction grating 51 attached to the optical element 20 and the associated second diffraction grating 52 attached to the projection objects box 30 this need not necessarily be the case and the first diffraction grating 51 may be attached to the projection objects box 30 and the second diffraction grating 52 attached to the optical element 20. The embodiment as illustrated is preferable however, because the extra weight of the optical components of the displacement measurement system 50 described below can be taken by the projection objects box 30 without being transferred through the actuator 40. Thus, the inertia of the optical element 20 is not dramatically increased by use of the displacement measurement system 50.

Other components in fixed relation to the projection objects box 30 and the second diffraction grating 52 are a light source 53 and a sensing system that includes three optical sensors or photodetectors (e.g., diodes) 54$a$, 54$b$ and 54$c$. The light source 53 may be remote from the displacement measurement system 50 to avoid local heating. The light may be transferred to the displacement measurement system 50 via an optical fibre. A lens 55 for focusing light from the light source 53 onto the second diffraction grating 52 and for focusing diffracted light from the second diffraction grating 52 onto sensors 54$a$, 54$b$, 54$c$ is provided between the second diffraction grating 52 and the light source 53 and sensing system 54 and is also fixed in position relative to the projection objects box 30.

The functional principle of the displacement measurement device of the present invention, which may be called an interferential linear encoder, is described in detail by SPIES, A. "Linear and Angular Encoders for the High-Resolution Range", Progress in Precision Engineering and Nanotechnology, Braunschweig, 1997.

The light source 53 provides a collimated light beam, which is perpendicular to the direction of measurement and falls on the second diffraction grating 52 where it is diffracted into three orders. The zero order is hidden, and only the +/−1 orders pass as a first diffracted light signal to the first diffraction grating 51. At the first diffraction grating 51 the first diffracted light signal is diffracted in a Littrow arrangement and reflected to form a second diffracted light signal. The second diffracted light signal interferes on the second diffraction grating 52 and is diffracted as it passes through the second diffraction grating 52 to form a third diffracted light signal. The third diffracted light signal is focused by lens 55 on the three photodetectors 54a, 54b, 54c of the sensing system.

The signal received by each of the photodetectors 54a, 54b, 54c is 120° phase shifted from the optical signals received by the other two photodetectors 54a, 54b, 54c. The outputs of the sensors 54a, 54b, 54c are constant if there is no relative movement of the first diffraction grating 51 relative to the second diffraction grating 52.

The electrical signals from the sensing system are converted by an electronic circuit into quadrature signals. On relative movement of the first diffraction grating 51 to the second diffraction grating 52, the output of the sensors 54a, 54b, 54c oscillates. The sine and cosine signals output by the circuit have a period of four times that of the diffraction grating (because of the double pass, whereas in an arrangement with transparent gratings, the electrical signal would have a period of only twice the grating period because there is only a single pass) when one diffraction grating is moved relative to the other. Thus, electronic interpolation, for example by a factor of $2^{14}$, easily leads to a measuring step of less than 0.1 nm.

The first diffraction grating 51 may have one or more reference marks adjacent the first diffraction grating 51 and corresponding marks adjacent the second diffraction grating 52 such that the absolute position of the optical element 20 can be sensed by another photodetector (not illustrated). The reference marks can be made to produce a separate reference signal.

As will be appreciated, measurement of the position of the optical element 20 in more than one degree of freedom is possible by use of further pairs of associated first 51 and second 52 diffraction gratings aligned orthogonally to the other pairs of diffraction gratings. Two orthogonal pairs of diffraction gratings may be provided in a single housing.

It will also be appreciated that other geometries of optics may be used in the displacement measurement system. For example, the collimated light beam from the light source 53 may fall on the second diffraction grating 52 at an oblique angle and a prism between the first and second diffraction gratings 51, 52 may be used to reflect the first and second diffracted light signals to the first and second diffraction gratings respectively. Furthermore, the second diffraction grating 52 may also be a reflective diffraction grating and many other different geometries are also available which work on the same principle as the one described above.

While specific embodiments of the invention have been described above, it will be appreciated that the invention may be practiced otherwise than as described. The description is not intended to limit the invention.

What is claimed is:

1. A lithographic projection apparatus, comprising:
    a radiation system constructed and arranged to provide a beam of radiation;
    a support structure constructed and arranged to support a patterning device, the patterning device constructed and arranged to pattern the beam according to a desired pattern;
    a substrate table constructed and arranged to hold a substrate;
    a projection system, comprising at least one optical element, constructed and arranged to project the patterned beam onto a target portion of the substrate; and
    a displacement measuring system constructed and arranged to measure the position of the at least one optical element, wherein the displacement measurement system comprises a first diffraction grating mounted on the at least one optical element and an associated second diffraction grating mounted on a reference frame, and one of the first and second diffraction gratings is arranged to receive diffracted light from the other diffraction grating.

2. An apparatus according to claim 1, wherein each diffraction grating has one or more associated reference marks for defining a reference position of the at least one optical element.

3. An apparatus according to claim 1, wherein the displacement measuring system is arranged such that light from a light source is diffracted by one of the first and second diffraction gratings thereby to generate a first diffracted light signal, the first diffracted light signal is diffracted by the other of the first and second diffraction gratings thereby to generate a second diffracted light signal, the second diffracted light signal is diffracted by the one of the first and second diffraction gratings thereby to generate a third diffracted light signal.

4. An apparatus according to claim 3, wherein the one of the first and second diffraction gratings is a transmissive diffraction grating and the other of the first and second diffraction gratings is a reflective diffraction grating.

5. An apparatus according to claim 4, wherein the reflective diffraction grating is mounted on the optical element.

6. An apparatus according to claim 3, wherein the displacement measurement system further comprises a sensing system constructed and arranged to receive light of the third diffracted light signal.

7. An apparatus according to claim 6, wherein the sensing system comprises three photosensors each for receiving a light signal 120° out of phase with light signal received by the other photosensors.

8. An apparatus according to claim 6, wherein the displacement measurement system comprises a processor constructed and arranged to convert light signals from the sensing system into positional information of the at least one optical element with reference to the reference frame by interpolation.

9. An apparatus according to claim 1, wherein the displacement measurement system comprises at least two first diffraction gratings and at least two second diffraction gratings, associated pairs of first and second diffraction gratings being mounted substantially orthogonally.

10. A device manufacturing method, comprising:
    providing a substrate that is at; least partially covered by a layer of radiation-sensitive material;
    projecting a patterned beam of radiation, using at least one optical element, onto a target portion of the layer of radiation-sensitive material; and
    measuring the position of the at least one optical member by:
        providing a first diffraction grating mounted on the at least one optical element and a second diffraction grating mounted on a reference frame and
        diffracting light diffracted by one of the first and second diffraction gratings with the other of the first and second diffraction gratings.

11. A method according to claim 10, wherein each diffraction grating has one or more associated reference marks for defining a reference position of the at least one optical element.

12. An apparatus according to claim 10, further comprising:
    diffracting light from a light source by one of the first and second diffraction gratings thereby to generate a first diffracted light signal;

diffracting the first diffracted light signal by the other of the first and second diffraction gratings thereby to generate a second diffracted light signal; and diffracting the second diffracted light signal by the one of the first and second diffraction gratings thereby to generate a third diffracted light signal.

13. A method according to claim 12, wherein the one of the first and second diffraction gratings is a transmissive diffraction grating and the other of the first and second diffraction gratings is a reflective diffraction grating.

14. A method according to claim 13, wherein the reflective diffraction grating is mounted on the optical element.

15. A method according to claim 12, further comprising receiving the third diffracted light signal with a sensing system.

16. A method according to claim 15, wherein the sensing system comprises three photosensors each for receiving a light signal 120° out of phase with light signal received by the other photosensors.

17. A method according to claim 16, further comprising converting light signals from the sensing system into positional information of the at least one optical element with reference to the reference frame by interpolation.

18. A method according to claim 10, wherein the first diffraction grating comprises at least two first diffraction gratings and the second diffraction grating comprises at least two second diffraction gratings, associated pairs of first and second diffraction grating being mounted substantially orthogonally.

19. A method according to claim 10, wherein the reflective diffraction grating is mounted on the reference frame.

20. An apparatus according to claim 1, wherein the reflective diffraction grating is mounted on the reference frame.

* * * * *

UNITED STATES PATENT AND TRADEMARK OFFICE
CERTIFICATE OF CORRECTION

PATENT NO. : 6,819,400 B2
DATED : November 16, 2004
INVENTOR(S) : Marius Ravensbergen It is certified that error appears in the above-identified patent and that said Letters Patent is hereby corrected as shown below:

Title page,
Item [73], Assignee, replace "ASMI Netherlands B.V., Veldhoven (NL)" with
-- ASML Netherlands B.V., Veldhoven (NL) --.

Signed and Sealed this

Tenth Day of May, 2005

JON W. DUDAS
*Director of the United States Patent and Trademark Office*